United States Patent
Määttä et al.

(10) Patent No.: US 11,564,322 B2
(45) Date of Patent: *Jan. 24, 2023

(54) MAGNETIC BLOCK LOCKING OF AN ELECTRONIC DEVICE

(71) Applicant: Microsoft Technology Licensing, LLC, Redmond, WA (US)

(72) Inventors: Esa Määttä, Espoo (FI); Niko Eiden, Espoo (FI); Otto Huittinen, Espoo (FI); Pasi Kemppinen, Tampere (FI); Antti Karilainen, Helsinki (FI); Vicente Calvo Alonso, Piispanristi (FI)

(73) Assignee: Microsoft Technology Licensing, LLC., Redmond, WA (US)

( * ) Notice: Subject to any disclaimer, the term of this patent is extended or adjusted under 35 U.S.C. 154(b) by 629 days.

This patent is subject to a terminal disclaimer.

(21) Appl. No.: 16/283,727

(22) Filed: Feb. 22, 2019

(65) Prior Publication Data

US 2019/0191578 A1 Jun. 20, 2019

Related U.S. Application Data

(63) Continuation of application No. 15/242,464, filed on Aug. 19, 2016, now Pat. No. 10,257,950.

(51) Int. Cl.
*H05K 5/02* (2006.01)
*H05K 9/00* (2006.01)
*H01F 7/02* (2006.01)

(52) U.S. Cl.
CPC ......... *H05K 5/0221* (2013.01); *H01F 7/021* (2013.01); *H01F 7/0205* (2013.01); *H01F 7/0263* (2013.01); *H05K 9/0075* (2013.01)

(58) Field of Classification Search
CPC ...... H01F 7/0205; H01F 7/021; H01F 7/0263; H05K 5/0221; H05K 9/0075
See application file for complete search history.

(56) References Cited

U.S. PATENT DOCUMENTS

| | | | | |
|---|---|---|---|---|
| 6,653,919 | B2 * | 11/2003 | Shih-Chung | G06F 1/162 24/303 |
| 8,289,115 | B2 * | 10/2012 | Cretella, Jr. | G06F 9/00 335/219 |
| 2008/0186683 | A1 * | 8/2008 | Ligtenberg | G06F 1/1679 361/726 |
| 2009/0296328 | A1 * | 12/2009 | Lin | G06F 1/1686 361/679.02 |
| 2014/0047677 | A1 * | 2/2014 | Trinh | G06F 1/1679 24/303 |
| 2014/0049894 | A1 * | 2/2014 | Rihn | G06F 1/1616 361/679.27 |
| 2014/0306463 | A1 * | 10/2014 | Ho | E05C 19/16 292/251.5 |

* cited by examiner

*Primary Examiner* — Bernard Rojas

(57) ABSTRACT

An electronic device or electronic device assembly may comprise a first portion and a second portion, a first magnet disposed inside the first portion and rotatable about a pivot axis with respect to the first portion, and a second magnet disposed inside the second portion and rotatable about a pivot axis with respect to the second portion. The first and second magnet may be configured to rotate so that the first and second magnets magnetically engage each other when the distance between the first and second magnet is equal to or smaller than a first distance.

20 Claims, 5 Drawing Sheets

MAGNETIC BLOCK LOCKING OF AN ELECTRONIC DEVICE

CROSS-REFERENCE TO RELATED APPLICATION

This application is a continuation of and claims priority to U.S. application Ser. No. 15/242,464 entitled "MAGNETIC BLOCK LOCKING OF AN ELECTRONIC DEVICE," filed on Aug. 19, 2016, which is incorporated herein by reference in its entirety.

BACKGROUND

Electronic devices may be available in foldable or pivotable form factors. In order to restrict the pivoting movement of two or more portions of such devices, locking of the portions in certain positions, for instance closed positions, may be desired.

Mechanical arrangements, such as dents or latches, may be used for locking such devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

An electronic device or electronic device assembly is disclosed. The electronic device or electronic device assembly may comprise a first portion and a second portion, a first magnet disposed inside the first portion and rotatable about a pivot axis with respect to the first portion, and a second magnet disposed inside the second portion and rotatable about a pivot axis with respect to the second portion. The first and second magnet may be configured to rotate so that the first and second magnets magnetically engage each other when the distance between the first and second magnet is equal to or smaller than a first distance.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein:

In FIGS. 1 to 5D, the electronic devices, device assemblies and magnets are illustrated as schematic drawings. The drawings may not be to scale.

DETAILED DESCRIPTION

The detailed description provided below in connection with the appended drawings is intended as a description of a number of embodiments and is not intended to represent the only forms in which the embodiments may be constructed, implemented, or utilized.

An electronic device or electronic device assembly is disclosed. The electronic device or electronic device assembly may comprise a first portion and a second portion, a first magnet disposed inside the first portion and rotatable about a pivot axis with respect to the first portion, and a second magnet disposed inside the second portion and rotatable about a pivot axis with respect to the second portion. The first and second magnet may be configured to rotate so that the first and second magnets magnetically engage each other when the distance between the first and second magnet is equal to or smaller than a first distance.

In one or more embodiments of the electronic device, the magnetic field outside of the first and second portion of the electronic device or device assembly may be minimized. Thereby it may be possible to reduce or eliminate the risk of the magnetic field outside the electronic device causing any harmful effects, such as erasing data from or destroying magnetic stripes in objects such as credit cards, keycards, identification badges, or magnetic cards from parking garages. There may be no need for an actuator to operate the magnets, although one or more actuators configured to rotate the first or second magnet may be included. The electronic device is relatively simple in terms of structure and may not be prone to mechanical failures. The electronic device or electronic device assembly according to one or more embodiments may be capable of locking the first and second portion to each other without mechanical dents, detents or latches. The first and second magnet and other components involved in the locking may not necessarily be at all visible to the outside of the electronic device. With at least two magnets, the locking may be efficient and sufficiently strong. Two magnets may be capable of magnetically engaging each other at a distance greater than a magnet and a magnetically permeable element, such as a ferromagnetic element. Further, electronic devices that are pivotable 180 degrees or 360 degrees may be locked.

Figure 1A:
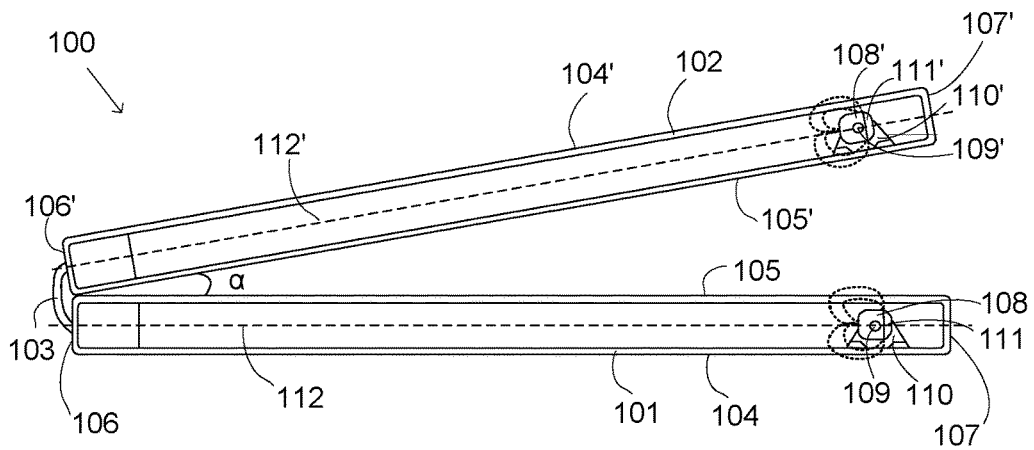
FIGS. 1A, 1B, 1C and 1D illustrate alternative schematic sectional side views and details of an embodiment of an electronic device.

FIG. 1A illustrates an electronic device 100 according to an embodiment. The electronic device 100 may be, for instance, a mobile device, a tablet computer, a laptop, a smartphone or a mobile phone, a phablet, a media player, a personal digital assistant, an e-book reader, a game console, a wearable device, a display or a flat-screen television. It comprises a first portion 101 and a second portion 102, such as blocks. The first and second portion 101, 102 may be pivotably, e.g. rotatably, hingedly or foldably, connected by a hinge region 103. The electronic device 100 may be pivotable, so that the first portion 101 may be pivoted with respect to the second portion 102. In this embodiment, the electronic device 100 is foldable. According to an embodiment, the hinge region 103 may also be a foldable region. The first portion 101 and the second portion 102 may be separate bodies, joined together by the hinge region 103, or they may be integral parts of the electronic device 100 formed as one single body e.g. by folding the electronic device 100 into two portions.

The "hinge region" may refer to any hinge element or structure providing pivoting, rotating, folding or hinged movement between the portions about an axis. The hinge region 103 may include any structural element which allows the portions 101 and 102 to fold and/or rotate with respect to each other. This folding and/or rotation may be along or substantially along the edges of portions 101 and 102 which are joined via the hinge region 103. The hinge region 103 may be a region of the electronic device 100 that is more easily foldable than other parts of the electronic device 100. The hinge region 103 may be any type of hinge region, for instance a live hinge. In an embodiment, the hinge region 103 comprises a hinge element. Further, the electronic device 100 may comprise one, two or more hinge elements, i.e. a plurality of hinge elements.

The hinge region 103 may allow various degrees of freedom of rotation or folding between the first and second portions 101 and 102. According to an embodiment, the hinge region 103 may provide freedom of rotation from 0 degrees to 180 degrees between the portions 101 and 102, allowing the device to be rotatable or foldable between a closed position, a flat position and a plurality of open positions.

According to another embodiment, the hinge region 103 may provide a freedom of rotation between 0 to 360 degrees. According to another embodiment, the hinge region 103 may provide freedom of rotation in any range selected from 0 to 360 degrees. According to an embodiment, the hinge region 103 may extend end to end between the edges of the first and second portion 101 and 102. According to another embodiment, the hinge region 103 may join the edges of the first and second portion 101 and 102 only at certain points along the edges.

The electronic device 100 of FIG. 1A is shown as a cross-sectional view. In this exemplary embodiment, the first portion 101 and the second portion 102 are substantially planar or planar with their length and width being substantially larger than their thickness, but in other embodiments, they may have different shapes. For example, in an embodiment, the first portion 101 and/or the second portion 102 is curved. The first portion 101 has two opposite main faces 104 and 105; the second portion 102 has two opposite main faces 104' and 105'. A first end 106 of the first portion 101 is connected to a first end 106' of the second portion by the hinge region 103. The first ends 106 and 106' are proximal to the hinge region 103. The first portion 101 has a second end 107 and the second portion 102 a second end 107', the second ends 107 and 107' being distal to the hinge region 103. The dimensions and shapes of the first and second portion 101, 102 and their faces and ends may depend e.g. on the type and overall size of the electronic device 100.

A first magnet 108 is disposed within the first portion 101. As it is disposed inside the first portion 101, it is not visible to the outside of the first portion 101. In this embodiment, the first magnet 108 is disposed distally to the hinge region 103. The first magnet 108 is rotatable about a pivot axis 109 so that it is rotatable with respect to the first portion 101. The first magnet 108 is connected to the first portion 101 via the pivot axis 109 and a rotation element 110. The rotation element 110 may be removably or irremovably attached to the first portion 101.

A second magnet 108' is disposed within the second portion 102. As it is disposed inside the second portion 102, it is not visible to the outside of the second portion 102. The second magnet 108' is rotatable about a pivot axis 109' so that it is rotatable with respect to the second portion 102. The second magnet 108' is connected to the second portion 102 via the pivot axis 109' and a rotation element 110'. The rotation element 110' may be removably or irremovably attached to the second portion 102.

Each of the first magnet 108 and the second magnet 108' may be any suitable magnet, for instance a permanent magnet of suitable dimensions, having a magnetic field of a suitable magnitude or flux density. The magnetic field is schematically illustrated by dashed lines. The first and second magnet 108, 108' may be alike or essentially identical to each other, but they do not necessarily have to be identical. In this embodiment, the first and second magnet 108, 108' are disposed distally to the hinge region 103.

In this embodiment, the electronic device 100 further comprises a first magnetic shield 111. The first magnetic shield 111 is configured to restrict the magnetic field of the first magnet 108. In this embodiment, the first magnetic shield 111 is substantially planar. The first magnetic shield 111 is configured to partially magnetically shield the first magnet 108, thereby restricting its magnetic field. While the first magnetic shield 111 does not eliminate the magnetic field of the first magnet 108, it may eliminate or reduce the effect of the magnetic field of the first magnet 108 in the direction of the first magnet 108 that is towards the first magnetic shield 111 by providing a path for completing a magnetic circuit. Subsequently, it may further preferentially guide or concentrate at least a part of the magnetic field or the strength of the magnetic field of the first magnet 108 that extends outside of the first magnetic shield 111 towards a desired side of the first magnet 108. The first magnetic shield 111 may be suitably shaped so as to restrict the magnetic field of the first magnet 108 as desired. As schematically illustrated by dashed lines, the density of the magnetic field extending outside the first magnetic shield 111 is substantially restricted or concentrated to a particular direction or a particular space surrounding the first magnet 108 at least partially. The electronic device 100 further comprises a second magnetic shield 111' that may be configured to function in the same manner as the first magnetic shield 111.

The first and second magnetic shields 111, 111' may be of a magnetically shielding material, such as a ferromagnetic material. For instance, the first and second magnetic shields 111, 111' may be formed of iron or other ferromagnetic metal, a ferromagnetic alloy, a Mu-metal, a nano-material with suitable magnetic permeability, or any other suitable material. The first and second magnetic shield 111, 111' may be alike or essentially identical to each other, but they do not necessarily have to be identical. They however may operate in a similar manner. The first and second magnetic shield 111, 111' may restrict the magnetic fields of the first and second magnet 108, 108' so that when the first and second magnet 108, 108' are not magnetically engaged, their magnetic fields are restricted substantially, i.e. mainly, within the first and second portion, respectively. In other words, most of the magnetic fields of the first and second magnet 108, 108' or their densities may be confined within the first and second portion 101, 102, respectively. Thus the strength of the magnetic field outside the first and second portion 101, 102, e.g. outside their main faces 104, 105, 104' 105' and optionally also outside the first and second ends 106, 106', 107, 107', i.e. leakage flux in the space outside the first and second portion 101, 102, may be minimized. In an embodiment, when the first and second magnet 108, 108' are not magnetically engaged, the strength of the magnetic field outside the first and second portion 101, 102, e.g. outside their main faces 104, 105, 104' 105' and optionally also outside the first and second ends 106, 106', 107, 107', may be at most 100 mT, or at most 40 mT. In contrast, the strength of the magnetic field inside the first and second portion 101, 102, such as in regions adjacent to the magnets 108, 108', may be much greater, for example of the magnitude of 1500 mT or more.

The first and second magnet 108, 108' may be attached, for instance fixedly attached, to their respective magnetic shields 111, 111'. The magnetic shields 111, 111' are thus configured to rotate simultaneously together with the first and second magnets 108, 108' to which they are attached. The polarities of the first and second magnet 108, 108' with respect to their respective magnetic shields may thus be configured to remain unchanged when the first and second magnet 108, 108' are rotated. The magnetic shields 111, 111' may be attached to the magnets 108, 108' by any suitable attachment arrangement, such as by an adhesive, by deposition, or by a suitable mechanical attachment structure.

In FIG. 1A, the electronic device 100 is in an open position, so that there is an angle α between the main face 105 of the first portion 101 and the main face 105' of the second portion 102. At the angle α between the first portion 101 and the second portion 102, the first magnet 108 and the second magnet 108' are disposed at a distance from each other that is greater than a first distance. The first distance may depend on the properties of the magnets 108, 108' and other properties of the electronic device 100 and may be predetermined. At a distance greater than the first distance, the first and second magnet 108, 108' are so far away from each other that any force that they may exert on each other, due to their magnetic fields, is too small to cause either magnet 108, 108' to rotate. Thus the first and second magnets 108, 108' are magnetically disengaged. In this open position, the first and second magnet 108, 108' are therefore in a release position. In the release position, the magnetic fields of the first and second magnet 108, 108' are restricted substantially within, i.e. inside, the first and second portion 101, 102, respectively. Thus the magnetic field (magnetic flux density) outside the first and second portion 101, 102, e.g. outside their main faces 104, 105, 104', 105' and optionally also outside the first and second ends 106, 106', 107, 107', is minimized. When the first and second magnet 108, 108' are in the release position, the strength of the magnetic field (magnetic flux density) outside the first and second portion 101, 102, e.g. outside their main faces 104, 105, 104', 105' and optionally also outside the first and second ends 106, 106', 107, 107' may be at most 100 mT, or at most 40 mT. In contrast, in the release position, the strength of the magnetic field inside the first and second portion 101, 102, such as in regions adjacent to the magnets 108, 108, may be much greater, for instance of the magnitude of 1500 mT or more. In the release position, the magnetic fields of the first and second magnet 108, 108', respectively, are restricted so that the magnetic field of the first magnet 108 (at least a portion of the magnetic field outside of the first magnetic shield 111) substantially or mainly extends or is concentrated towards a direction that is parallel to a central axis 112 of the first portion 101, and the magnetic field of the second magnet 108' substantially or mainly extends or is concentrated towards a direction that is parallel to a central axis 112' of the second portion 102.

Figure 1B:
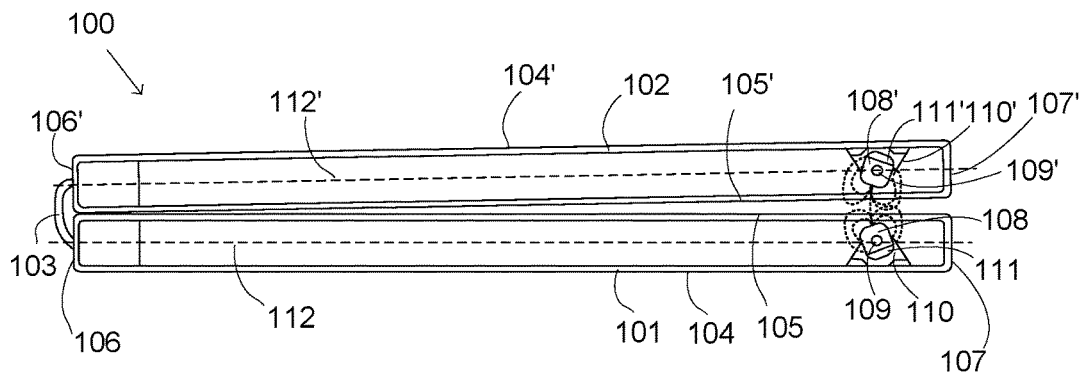

In FIG. 1B, the electronic device 100 is in another open position, in which there is an angle smaller than the angle α between the main face 105 of the first portion 101 and the main face 105' of the second portion 102. At this angle between the first portion 101 and the second portion 102, the first magnet 108 and the second magnet 108' are disposed at a distance from each other that is substantially equal to the first distance. In an embodiment, the angle in which the distance between the first and second magnet 108, 108 is equal to the first distance is equal to or greater than 2 degrees, or equal to or greater than 5 degrees. At this distance, the first and second magnet 108, 108' are sufficiently near to each other so that they may exert a magnetic force on each other, caused by their magnetic fields, that is sufficient to cause both magnets 108, 108' to magnetically engage each other and to rotate towards each other and towards a locking position. The first and second magnet 108, 108' are configured to rotate so that the magnetic fields of the first and second magnet 108, 108' are guided substantially or mainly towards each other when the first and the second magnets are magnetically engaging each other. In an embodiment, the magnetic fields of the first and second magnet 108, 108' are guided substantially or mainly towards each other when a greater magnetic flux density of the first magnet 108 (at least a portion of the magnetic flux density outside of the first magnetic shield 111) is guided towards the second magnet 108' than towards the direction opposite to the second magnet 108' and a greater magnetic flux density of the second magnet 108' (at least a portion of the magnetic flux density outside of the second magnetic shield 111') is guided towards the first magnet 108 than towards the direction opposite to the first magnet 108.

Figure 1C:
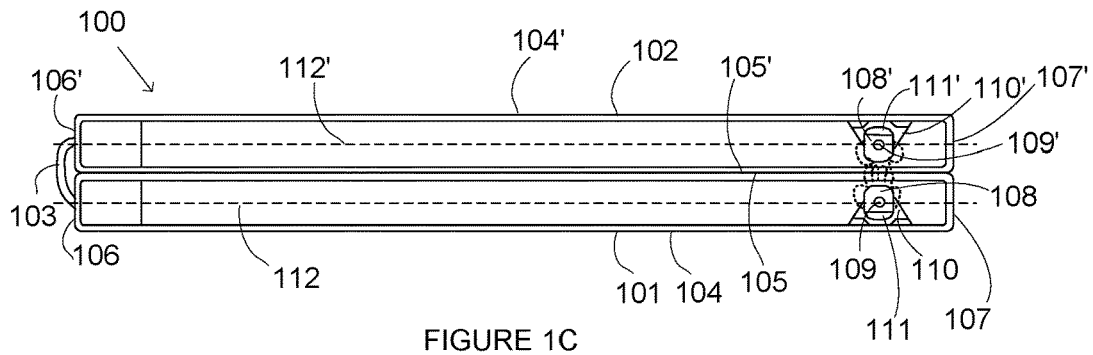

In FIG. 1C, the electronic device 100 is in a closed position. In the closed position, the first portion 101 and the second portion 103, i.e. the main faces 105 and 105', face each other and may rest against each other. In the closed position, the distance between the first and second magnets 108, 108' is smaller than the first distance and they are in the locking position. In the locking position, the first and second magnets 108, 108' magnetically engage each other. As the first and second magnets 108, 108' are near to each other, they complete a magnetic circuit, thereby exerting a force on each other sufficiently strong to lock the electronic device 100 in the closed position. The polarities of the first and second magnets 108, 108' may be arranged such that they attract each other and magnetically engage each other with a sufficient strength to retain, i.e. lock, the electronic device 100 in the closed position. For instance, the south pole of the first magnet 108 may face the north pole of the second magnet 108' in the locking position, or vice versa.

Figure 1D:
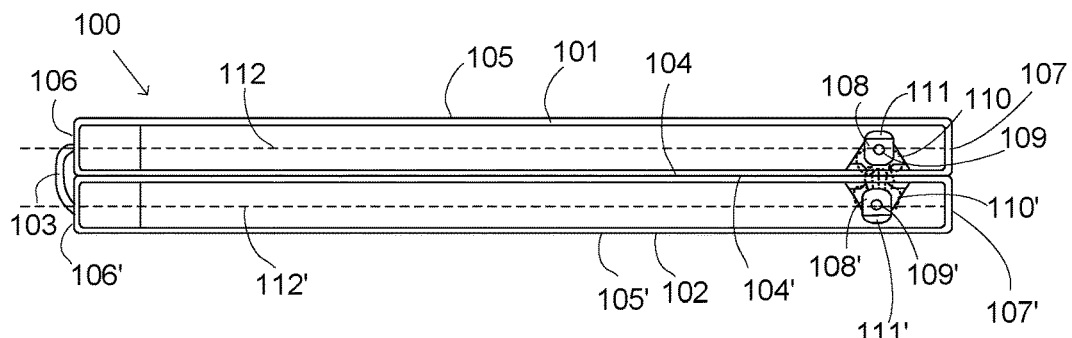

In FIG. 1D, the electronic device 100 is in another closed position. FIG. 1D differs from FIG. 1C in at least that the second portion 102 has been rotated substantially 360 degrees with respect to the closed position shown in FIG. 1C. The main faces 104, 104' now face each other and may rest against each other, and the first and second magnets 108, 108' are in a second locking position. In this embodiment, the first and second magnets 108, 108' are configured to rotate towards both of the two main faces 104, 105 of the first portion 101 and the two main faces 104', 105' of the second portion 102, respectively. The first and second magnets 108, 108' may be configured to symmetrically rotate towards both of the two main faces 104, 105 of the first portion 101 and the two main faces 104', 105' of the second portion 102, respectively. Further in this embodiment, the first and second magnet 108, 108' are configured to rotate between at least +80° and −80° or at least +90° and −90° with respect to the release position or about the central axes 112, 112' of the first and second portion 101, 102, respectively. They are therefore configured to be rotatable between the two locking positions and the release position. In an embodiment, the first and second magnets 108, 108' are symmetrically rotatable about the central axes 112, 112' of the first and second portions 101, 102, respectively.

Figure 2A:
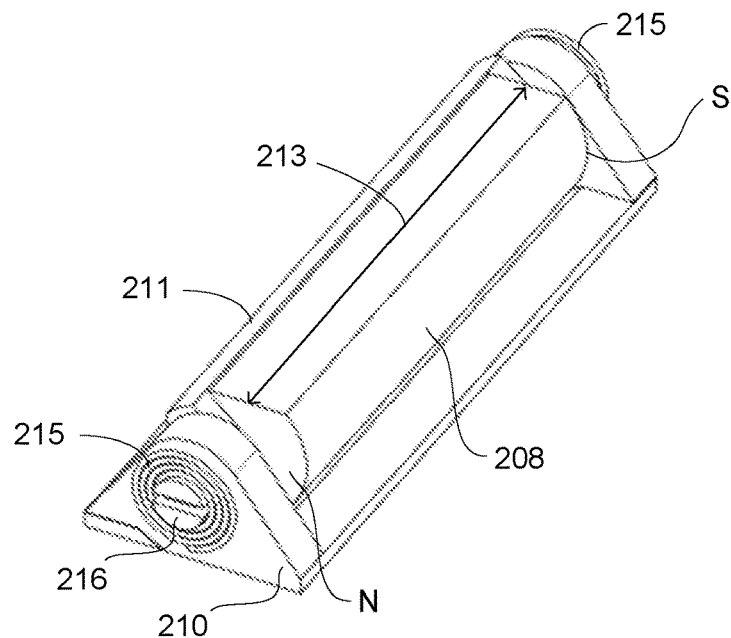
FIG. 2A illustrates a perspective view of an embodiment of a magnet for an electronic device or electronic device assembly.

FIG. 2A illustrates a perspective view of an embodiment of a magnet 208, which is a bar-shaped permanent magnet having a north pole N and a south pole S. The magnet 208 is fixedly attached to a magnetic shield 211, which may be formed of any magnetically shielding material, including any magnetically shielding material described in this specification. The magnetic shield 211 comprises shafts 216, which function as the pivot axis about which the magnet 208 is rotatable. The magnet 208 is connected to a rotation element 210 via the magnetic shield 211. The rotation element 210 may be a bracket formed of any suitable material, including any suitable magnetically non-shielding material, such as plastic. In this embodiment, the rotation element 210 is monolithic. In this embodiment, the magnetic axis 213 of the magnet 208 is parallel to the pivot axis of the magnet 208.

In this embodiment, returning elements 215 are configured to return the magnet to the release position. Two returning elements 215 may be connected to the shafts 216 and to the rotation element 210. The returning elements 215 may be elastic elements. In an embodiment, the elastic elements are spring elements, such as torsion springs depicted in this FIG.

Figure 2B:
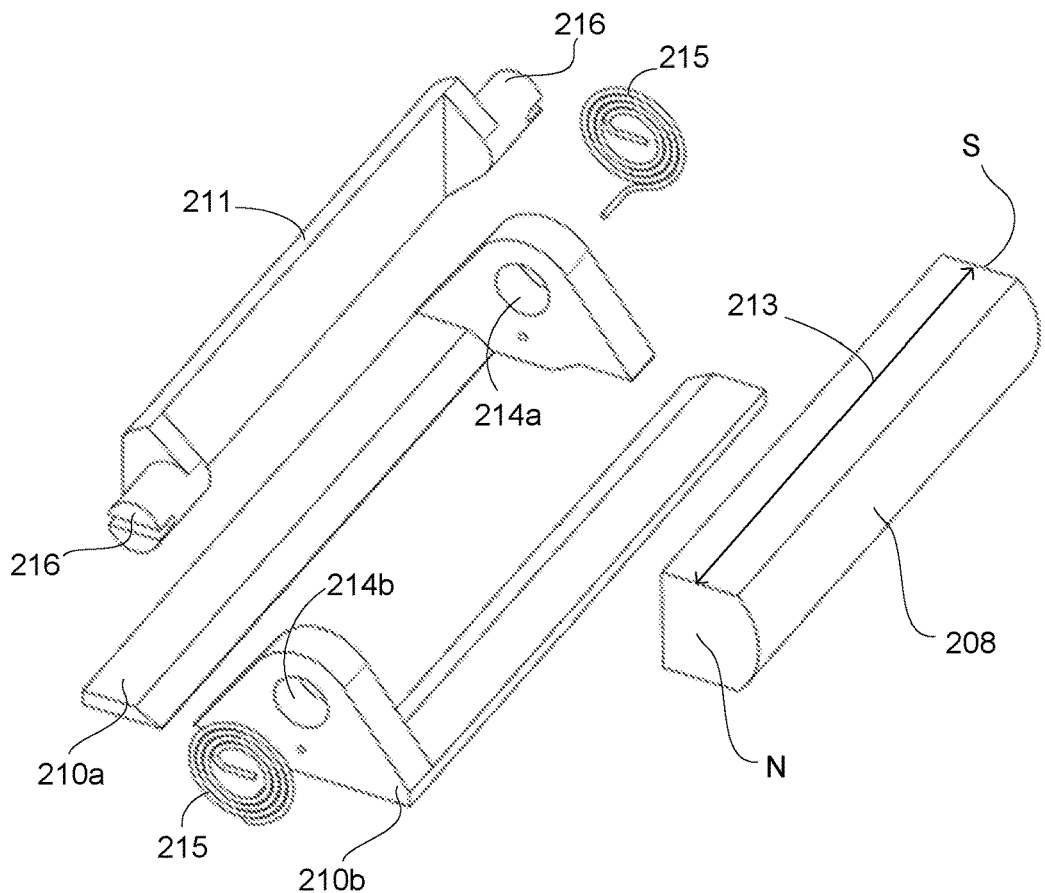
FIG. 2B illustrates an embodiment of a magnet in an exploded view.

FIG. 2B shows an embodiment of a magnet 208 of FIG. 2A in an exploded view. The rotation element 210 is comprised of two portions 210a and 210b, each of which has an orifice 214a and 214b configured to receive and engage one of the shafts 216. Other aspects of the embodiment shown in FIG. 2B are generally similar to those of the embodiment shown in FIG. 2A.

Figure 3A:
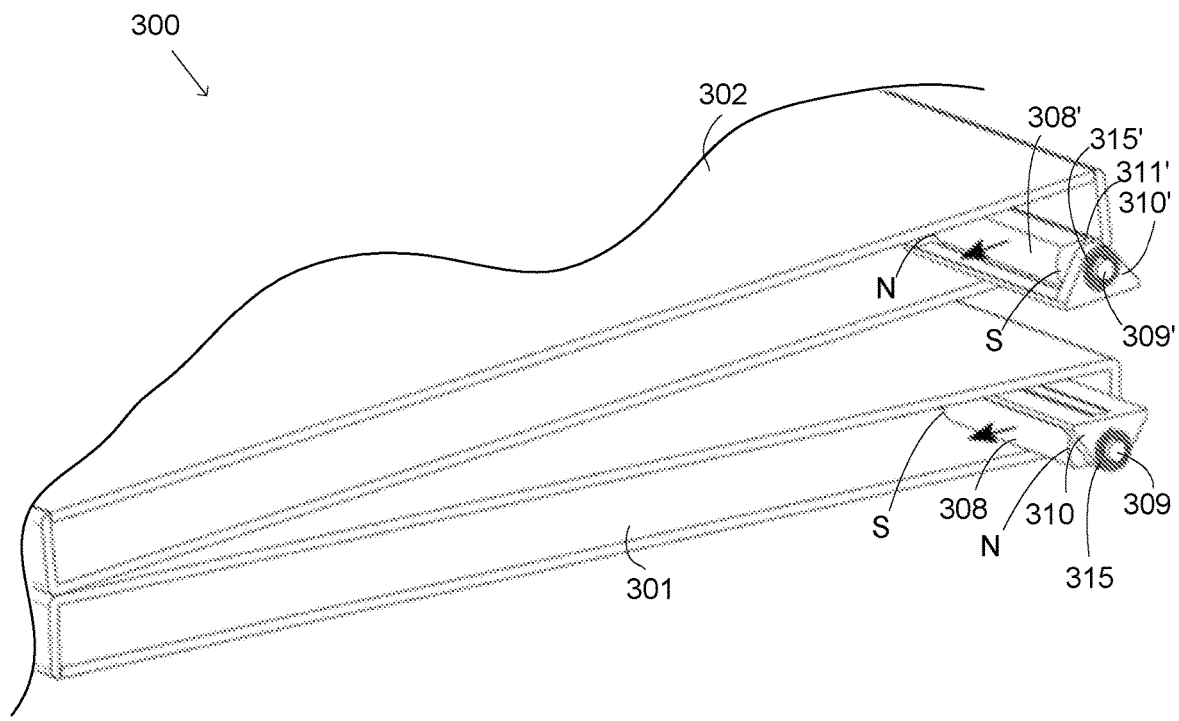
FIGS. 3A and 3B illustrate alternative schematic sectional views and details of another embodiment of an electronic device.

FIG. 3A illustrates a schematic cross-sectional view of an electronic device 300 comprising a pair of magnets 308, 308', which may be similar to the magnets of the embodiments described in FIGS. 2A and 2B. In this exemplary embodiment, the first and second magnets 308, 308' are disposed within, i.e. inside the first and second portions 301, 302, respectively, so that the rotation elements 310, 310' are attached to inside surfaces of the first and second portions 301, 302, respectively.

In FIG. 3A, the first portion 301 and the second portion 302 are rotated to an open position, and the first and second magnet 308, 308' are in the release position, with their magnetic fields being restricted by the first and second magnetic shields 311, 311' substantially within, i.e. inside, the first and second portion 301, 302, respectively.

Figure 3B:
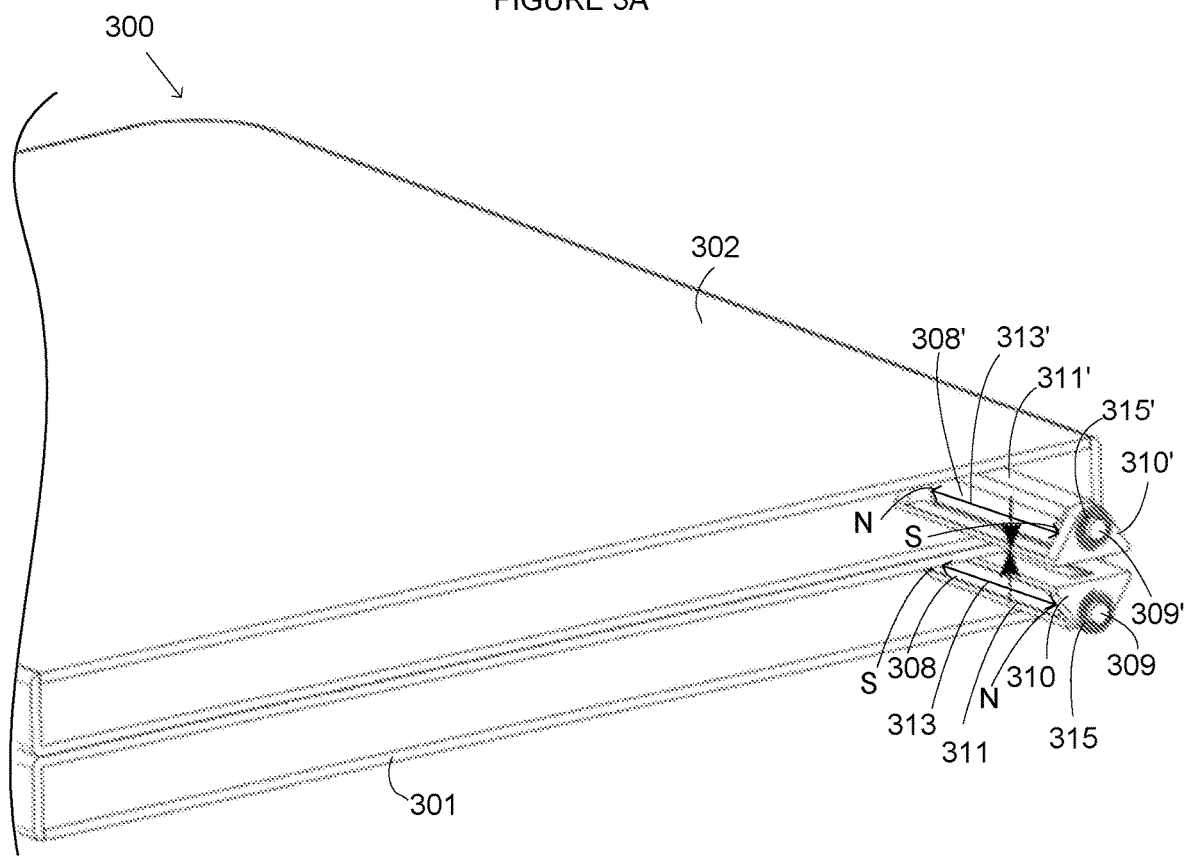

FIG. 3B differs from FIG. 3A at least in that the first portion 301 and the second portion 302 are rotated to a closed position, and the first and second magnet 308, 308' are in the locking position. In this position, the first and second magnets 308, 308' magnetically engage each other and magnetically lock the first and second portion 301, 302 to each other. In this embodiment, the magnetic axes 313, 313' of the first and second magnets 308, 308' are parallel to their pivot axes 309, 309'. The first and second magnets 308, 308' are oriented so that the north pole N of the first magnet 308 faces the south pole S of the second magnet 308', so that the magnets may attract each other. The rotation elements 310, 310' formed of a non-shielding material do not have a marked magnetic shielding effect and therefore do not interfere with the magnetic fields. The returning elements 315, 315', which in this embodiment are torsion springs, are twisted in the locking position.

Figure 4A:
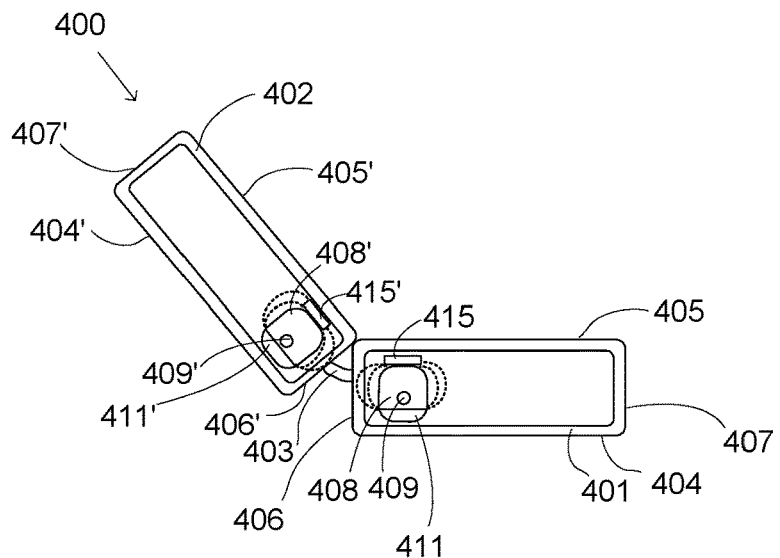
FIGS. 4A, 4B and 4C illustrate alternative schematic sectional views and details of another embodiment of an electronic device and a device assembly.

FIG. 4A illustrates an electronic device 400 according to an embodiment. The electronic device 400 of FIG. 4A is shown as a schematic cross-sectional view. It comprises a first portion 401 and a second portion 402 pivotably, e.g. rotatably, hingedly or foldably, connected by a hinge region 403. The electronic device 400 may be pivotable, so that the first portion 401 may be pivoted with respect to the second portion 402. The hinge region 403 may allow various degrees of freedom of rotation or folding between the first and second portions 401 and 402. According to an embodiment, the hinge region 403 may provide freedom of rotation from 0 degrees to 180 degrees between the first and second portion 401 and 402, allowing the device to be rotatable or foldable between a closed position, a flat position and a plurality of open positions. According to an embodiment, the hinge region 403 may provide freedom of rotation from 0 degrees to 360 degrees between the first and second portion 401 and 402, allowing the device to be rotatable or foldable between at least one closed position, a flat position and a plurality of open positions.

The first portion 401 has two opposite main faces 404 and 405; the second portion 402 has two opposite main faces 404' and 405'. A first end 406 of the first portion 401 is connected to a first end 406' of the second portion by the hinge region 403. The first ends 406 and 406' are proximal to the hinge region 403. The first portion 401 has a second end 407 and the second portion 402 a second end 407', the second ends 407 and 407' being distal to the hinge region 403.

A first magnet 408 is disposed within the first portion 401 near to the hinge region 403, i.e. proximally to the hinge region 403. The first magnet 408 is rotatable about a pivot axis 409 so that it is rotatable with respect to the first portion 401. A second magnet 408' is disposed within the second portion 402. The second magnet 408' is rotatable about a pivot axis 409' so that it is rotatable with respect to the second portion 402. A first magnetic shield 411 is configured to restrict and guide the magnetic field of the first magnet 408. A second magnetic shield 411' is configured to restrict and guide the magnetic field of the second magnet 408'.

In FIG. 4A, the electronic device 400 is in an open position. In the open position, the first magnet 408 and the second magnet 408' are disposed at a distance from each other that is greater than a first distance. In this open position, the first and second magnet 408, 408' are thus in a release position. In the release position, the magnetic fields of the first and second magnets 408, 408' are restricted substantially inside the first and second portions 401, 402, respectively. Thus the magnetic field outside the first and second portion 401, 402, e.g. outside their main faces 404, 405, 404' 405' and in some embodiments also outside the first and second ends 406, 406', 407, 407', is minimized. When the first and second magnets 408, 408' are in the release position, the strength of the magnetic field (magnetic flux density) outside the first and second portion 401, 402, e.g. outside their main faces 404, 405, 404' 405' and optionally also outside the first and second ends 406, 406', 407, 407', may be at most 100 mT, or at most 40 mT. In an embodiment, the magnetic fields of the first and second magnets 408, 408' are restricted substantially inside the first and second portion 401, 402, respectively, when the strength of the magnetic fields (magnetic flux density) outside the first and second portions 401, 402, e.g. outside their main faces 404, 405, 404' 405' and optionally also outside the first and second ends 406, 406', 407, 407', is at most 100 mT, or at most 40 mT.

The electronic device 400 further comprises a first and second returning element 415, 415' that are configured to return the first and second magnet 408, 408', respectively, to the release position. In this embodiment, the first and second returning element 415, 415' are magnetically attractable elements. The magnetically attractable elements may be e.g. magnets, for instance magnets to which the first and second magnet 408, 408' are attracted. However, in embodiments in which at least one of the magnetically attractable elements is a magnet, it may have a magnetic field having a strength smaller than the first and second magnet 408, 408', so that the first and second magnet 408, 408' are preferentially attracted to each other rather than to the magnetically attractable elements when the distance between the first and second magnet 408, 408' is greater than a first distance. In other embodiments, the magnetically attractable elements may be other suitable magnetically attractable elements, e.g. ferromagnetic elements, such as iron plates. In such embodiments, the returning elements 415, 415' may function as magnetic shields instead of or in addition to the first and second magnetic shields 411, 411', and thereby be configured to restrict and guide the magnetic fields of the first and second magnet 408, 408' substantially inside the first and second portion 401, 402, respectively. In such embodiments, the forces created by the first and second magnet 408, 408' and the returning elements 415, 415' may be suitably balanced.

Figure 4B:
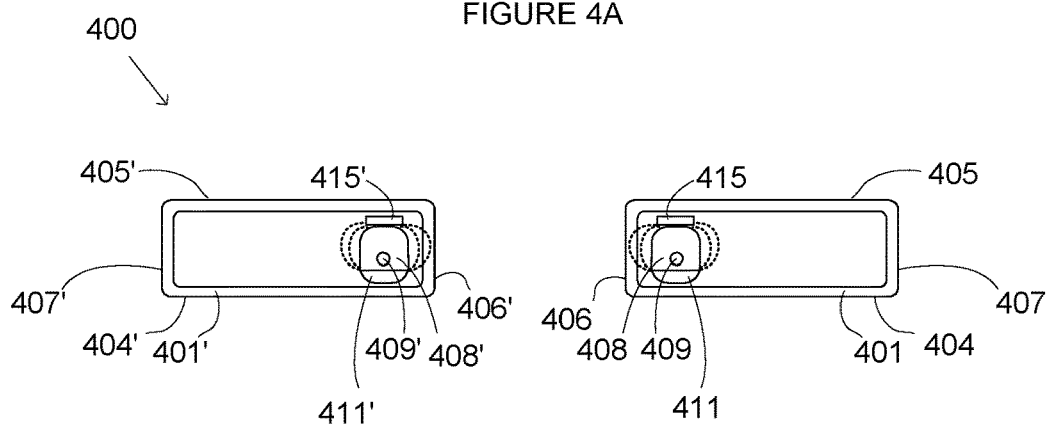

FIG. 4B differs from FIG. 4A at least in that it illustrates an electronic device assembly 400 that does not comprise a pivot or hinge region. The first portion 401 and the second portion 402 are not connected to each other in this position but are apart from each other, so that there is a distance between the first and second magnets 408, 408' that is greater than a first distance. The magnetic fields of the first and second magnets 408, 408' are restricted substantially inside the first and second portions 401, 402, and the first and second magnets 408, 408' do not magnetically engage each other. The first and second magnets 408, 408' are disposed near to the first ends 406, 406' of the first and second portion 401, 402, respectively, so that the first and second portions 401, 402 may be locked end-to-end, i.e. with the first ends 406, 406' facing each other and optionally also resting against each other.

Figure 4C:
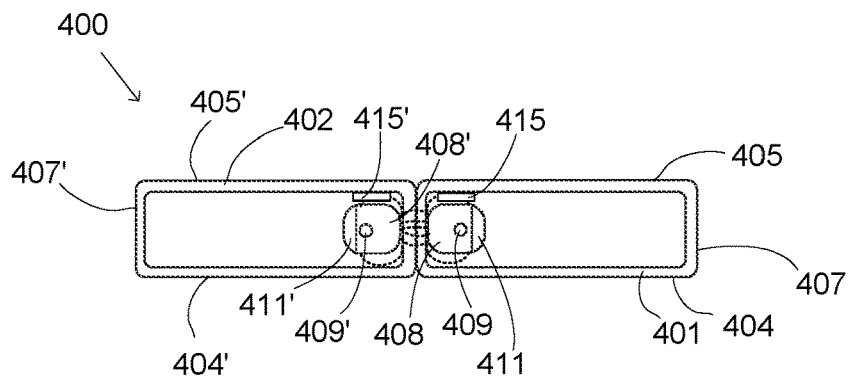

FIG. 4C shows the electronic device 400 shown in FIG. 4A or the electronic device assembly 400 shown in FIG. 4B in a flat position, with the first and second magnets 408, 408' magnetically engaging each other. In this flat position, the electronic device or electronic device assembly 400 may be substantially planar or planar. In the flat position, the distance between the first and second magnets 408, 408' is smaller than the first distance, and thus they are in the locking position. In the locking position, the first and second magnets 408, 408' magnetically engage each other. As the first and second magnets 408, 408' are near to each other, they complete a magnetic circuit, thereby exerting a force on each other sufficiently strong to lock the electronic device or electronic device assembly 400, i.e. the first and second portions 401, 402 in the flat position. Again, the polarities of the first and second magnets 408, 408' may be arranged such that they attract each other and magnetically engage each other with a sufficient strength to retain, i.e. lock, the electronic device or electronic device assembly 400 in the flat position. The first and second portions 401, 402 may thus be locked end-to-end, i.e. with the first ends 406, 406' facing each other and optionally also resting against each other.

In these exemplary embodiments, the electronic device or electronic device assembly 400 may be but does not necessarily have to be lockable also in a closed position (not shown).

Figure 5A:
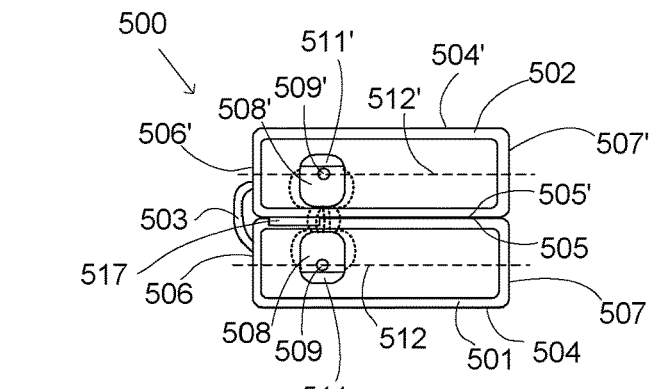
FIGS. 5A, 5B, 5C and 5D illustrate alternative schematic sectional views and details of another embodiment of an electronic device.

FIG. 5A illustrates a cross-sectional schematic view of an electronic device 500 according to an embodiment comprising a first portion 501 having opposite main faces 504 and 505 and a second portion 502 having opposite main faces 504' and 505'. The first portion 501 and the second portion 502 are rotatable about a pivot region 503. In FIG. 5A, the electronic device 500 is in a closed position. In the closed position, the first portion 501 and the second portion 502, i.e. the main faces 505 and 505', face each other and may rest against each other. In the closed position, the distance between the first and second magnet 508, 508' is smaller than a first distance and the first and second magnet 508, 508' magnetically engage each other. As the first and second magnet 508, 508' are near each other, they complete a magnetic circuit, thereby exerting a force on each other and locking the electronic device 500 in the closed position. The polarities of the first and second magnet 508, 508' may be arranged such that they attract each other and magnetically engage each other with a sufficient strength to retain, i.e. lock, the electronic device 500 in the closed position. For instance, the south pole of the first magnet 508 may face the north pole of the second magnet 508' in the locking position, or vice versa. In this embodiment, the magnets 508, 508' may also be similar to the magnets of the embodiments described in FIGS. 2A to 3B.

In this embodiment, the first and second magnet 508, 508' are disposed proximally to the pivot region 503, which may be e.g. a hinge element. They are thus disposed near to the pivot region 503.

As the electronic device 500 is pivoted between positions, the magnetic fields within, on and/or outside the electronic device 500 may change. In an embodiment, the electronic device comprises a sensor 517 configured to detect at least one of the magnetic fields of the first and second magnet and/or any changes thereof and thereby determine an angle between the first and second portion. The sensor 517 may be e.g. a Hall effect sensor.

Figure 5B:
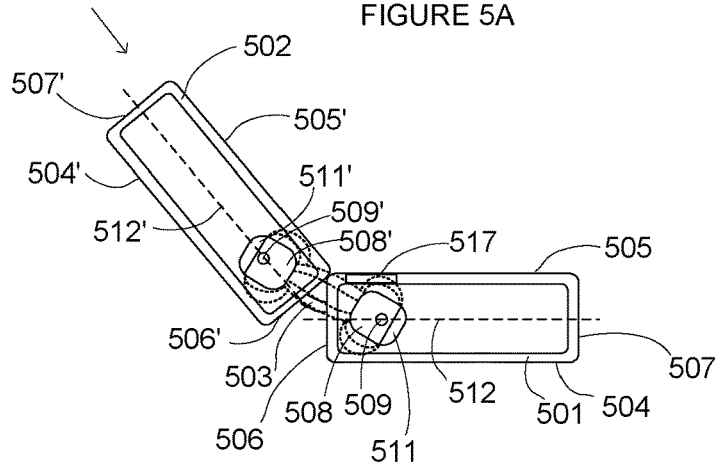

FIG. 5B illustrates the same electronic device 500 in an open position. In this embodiment, the first portion 501 is pivotable with respect to the second portion 502 between the closed position and a plurality of open positions, including this open position, with the first and second magnet 508, 508' being magnetically engaged to each other with the first portion 501 being pivoted with respect to the second portion 502. The first and second magnet 508, 508' may remain magnetically engaged to each other between and in the open and closed positions. The first and second magnet 508, 508' may remain continually or continuously magnetically engaged to each other between and in the open and closed positions. In this embodiment, the distance between the first and second magnet may be considered to be continually or continuously smaller than a first distance. In this embodiment, the first and second magnet 508, 508' may be freely rotatable about their respective pivot axes 509, 509' when magnetically disengaged from each other; there may not be a need for a returning element. The first and second magnet 508, 508' may, in this embodiment, be configured to be in a locking position between the closed position and a plurality of open positions, optionally including a flat position.

Figure 5C:
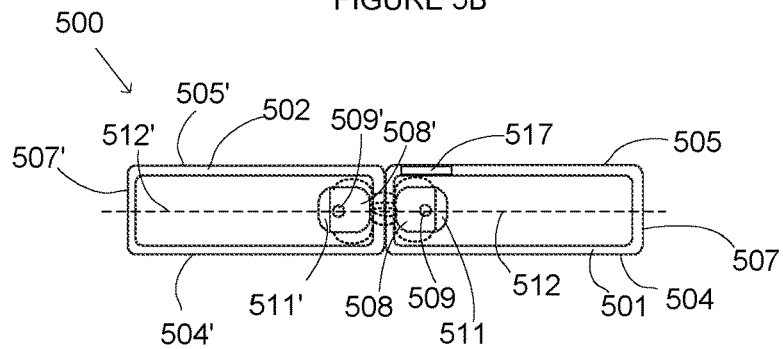

FIG. 5C illustrates the electronic device 500 in such a flat position. In the flat position, the electronic device 500 may be substantially planar or planar. In the flat position, the first and second magnets 508, 508' remain oriented so that the first and second magnet 508, 508' thereby remain magnetically engaged to each other. As the first and second magnet 508, 508' are disposed near the pivot region 503, in the flat position they are at a relatively short distance from each other and may lock the electronic device 500 in the flat position.

Figure 5D:
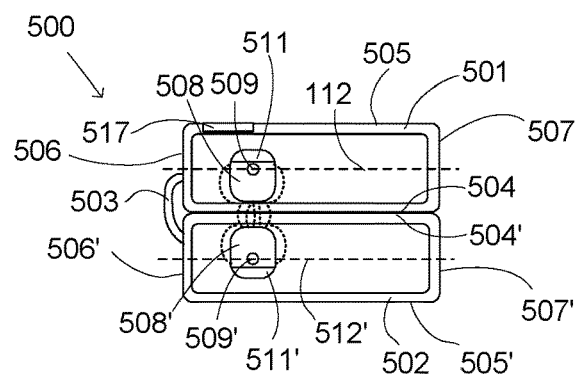

In FIG. 5D, the electronic device 500 is in another closed position. FIG. 5D differs from FIG. 5A in at least that the second portion 502 has been rotated substantially 360 degrees with respect to the closed position shown in FIG. 5A. The main faces 504, 504' now face each other and may rest against each other. The first and second magnet 508, 508' are configured to be magnetically engaged to each other with the first portion 501 being pivoted with respect to the second portion 502 between the closed positions shown in FIGS. 5A and 5D and thus also in the open and flat positions. In this embodiment, the first and second magnet 508, 508' are configured to rotate towards both of the two main faces 504, 505 of the first portion 501 and the two main faces 504', 505' of the second portion 502, respectively. Further in this embodiment, the first and second magnets 508, 508' are configured to rotate between at least +80° and −80° or at least +90° and −90° about the central axes 512, 512' of the first and second portion 501, 502, respectively. In an embodiment, the first and second magnet 508, 508' are symmetrically rotatable about the central axes 512, 512' of the first and second portion 501, 502, respectively.

In this embodiment, the first and second magnetic shields 511, 511' may restrict the magnetic fields of the first and second magnet 508, 508' so that the magnetic fields are restricted substantially within the first and second portion 501, 502, respectively. In other words, most of the magnetic fields of the first and second magnet 508, 508' or their densities may be confined within the first and second portion 501, 502, respectively. Thus the strength of the magnetic field outside the first and second portion 501, 502, e.g. outside their main faces 504, 505, 504', 505' and optionally also outside the first and second ends 506, 506', 507, 507', may be minimized. In an embodiment, the strength of the magnetic field outside the first and second portion 501, 502, e.g. outside their main faces 504, 505, 504', 505' and optionally also outside the first and second ends 506, 506', 507, 507', may be at most 100 mT, or at most 40 mT. In contrast, the strength of the magnetic field inside the first and second portion 501, 502, such as in regions adjacent to the magnets 508, 508', may be much greater, for example of the magnitude of 1500 mT or more.

Some embodiments are further discussed shortly in the following.

In a first aspect, an electronic device or electronic device assembly may comprise a first portion and a second portion; a first magnet disposed inside the first portion and rotatable about a pivot axis with respect to the first portion; a second magnet disposed inside the second portion and rotatable about a pivot axis with respect to the second portion; wherein the first and second magnet are configured to rotate so that the first and second magnet magnetically engage each other when the distance between the first and second magnet is equal to or smaller than a first distance.

In an embodiment which may be in accordance with the preceding embodiment, the first and second portions are pivotably connected to each other.

In an embodiment which may be in accordance with any of the preceding embodiments, the electronic device or electronic device assembly comprises a first and second magnetic shield configured to partially magnetically shield the first and second magnet, respectively, thereby restricting their magnetic fields.

In an embodiment which may be in accordance with any of the preceding embodiments, the polarities of the first and second magnet with respect to their respective magnetic shields are configured to remain unchanged when the first and second magnet are rotated.

In an embodiment which may be in accordance with any of the preceding embodiments, the first and second magnets are attached to their respective magnetic shields so that the magnetic shields are configured to rotate simultaneously with the first and second magnet.

In an embodiment which may be in accordance with any of the preceding embodiments, the strength of the magnetic field outside of the first and second portion is configured to be at most 100 mT when the first and second magnets are not magnetically engaged.

In an embodiment which may be in accordance with any of the preceding embodiments, each of the first portion and second portion has at least two opposite main faces and a first end, and the first and second magnets are disposed near to the first ends of the first and second portion, respectively, so that the first and second magnet are configured to rotate so that they magnetically engage each other when the distance between the first and second magnet is equal to or smaller than a first distance, the first and second portion thereby being configured to be magnetically locked with the first ends facing each other.

In an embodiment which may be in accordance with any of the preceding embodiments or in a second aspect, an electronic device comprises a first portion and a second portion, the first and second portion being pivotably connected to each other; a first magnet having a magnetic field, the first magnet being disposed inside the first portion and rotatable about a pivot axis with respect to the first portion between a release position and a locking position; a second magnet having a magnetic field, the second magnet being disposed inside the second portion and rotatable about a pivot axis with respect to the second portion between a release position and a locking position; wherein the first magnet and second magnet are configured to rotate to the locking position when the distance between the first and second magnet is equal to or smaller than a first distance, and to the release position when the distance between the first and second magnet is greater than the first distance; wherein in the release position, the magnetic fields of the first and second magnet are restricted substantially within the first and second portion, respectively, and in the locking position, the first and second magnet magnetically engage each other.

In an embodiment which may be in accordance with any of the preceding embodiments or in a further aspect, an electronic device comprises a first portion and a second portion, the first and second portion being pivotably connected to each other; a first magnet having a magnetic field, the first magnet being disposed inside the first portion and rotatable about a pivot axis with respect to the first portion between a release position and a locking position; a second magnet having a magnetic field, the second magnet being disposed inside the second portion and rotatable about a pivot axis with respect to the second portion between a release position and a locking position; wherein the first magnet and second magnet are configured to rotate to the locking position when the distance between the first and second magnet is smaller than a first distance, and to the release position when the distance between the first and second magnet is greater or equal to than the first distance; wherein in the release position, the magnetic fields of the first and second magnet are restricted substantially within the first and second portion, respectively, and in the locking position, the first and second magnet magnetically engage each other.

In an embodiment which may be in accordance with any of the preceding embodiments, the electronic device comprises a first magnetic shield and a second magnetic shield configured to partially magnetically shield the first and second magnet, respectively, thereby restricting their magnetic fields.

In an embodiment which may be in accordance with any of the preceding embodiments, the strength of the magnetic field outside of the first and second portion is configured to be at most 100 mT with the first and second magnet being in the release position.

In an embodiment which may be in accordance with any of the preceding embodiments, each of the first portion and second portion has at least two opposite main faces, and the first and second magnet are symmetrically rotatable towards both of the at least two main faces.

In an embodiment which may be in accordance with any of the preceding embodiments, the first and second magnet are rotatable between at least +80° and −80° or between at least +90° and −90°.

In an embodiment which may be in accordance with any of the preceding embodiments, the first and second magnet are rotatable about pivot axes parallel or substantially parallel to the magnetic axes of the first and second magnet, respectively.

In an embodiment which may be in accordance with any of the preceding embodiments, the electronic device or electronic device assembly is pivotable between a closed position and an open position, wherein in the closed position, the first and second magnet are in the locking position, thereby locking the electronic device in the closed position, and in the open position, the first and second magnet are in the release position.

In an embodiment which may be in accordance with any of the preceding embodiments, the electronic device or electronic device assembly is pivotable to a flat position, wherein in the flat position, the first and second magnet are in the locking position.

In an embodiment which may be in accordance with any of the preceding embodiments, the electronic device or electronic device assembly comprises a first returning element configured to return the first magnet to the release position and a second returning element configured to return the second magnet to the release position when the distance between the first and second magnet is greater than the first distance.

In an embodiment which may be in accordance with any of the preceding embodiments, at least one of the first and second returning elements is an elastic element or a magnetically attractable element.

In an embodiment which may be in accordance with any of the preceding embodiments, at least one of the first and second returning elements is a magnetically attractable element.

In an embodiment which may be in accordance with any of the preceding embodiments, at least one of the first and second returning elements is an elastic element.

In an embodiment which may be in accordance with any of the preceding embodiments, the elastic element is a spring element.

In an embodiment which may be in accordance with any of the preceding embodiments, the spring element is a torsion spring.

In an embodiment which may be in accordance with any of the preceding embodiments or in a third aspect, an electronic device or electronic device assembly comprises a first portion and a second portion, the first and second portion being pivotably connected to each other; a first magnet disposed inside the first portion and rotatable about a pivot axis with respect to the first portion; a second magnet disposed inside the second portion and rotatable about a pivot axis with respect to the second portion; wherein the first portion is pivotable with respect to the second portion between an open position and a closed position with the first and second magnet being magnetically engaged to each other between the open position and the closed position.

In an embodiment which may be in accordance with any of the preceding embodiments, the electronic device or electronic device assembly is pivotable to a flat position, wherein in the flat position, the first and second magnet magnetically engage each other, thereby locking the electronic device or electronic device assembly into the flat position.

In an embodiment which may be in accordance with any of the preceding embodiments, the first portion and the second portion are pivotally connected via a pivot or hinge region, and the first and second magnet are disposed near to the pivot or hinge region.

In an embodiment which may be in accordance with any of the preceding embodiments, the electronic device comprises magnetic shields configured to partially magnetically shield the first and second magnet, thereby restricting their magnetic fields.

In an embodiment which may be in accordance with any of the preceding embodiments, wherein the electronic device or electronic device assembly comprises a sensor configured to detect at least one of the magnetic fields of the first and second magnet and thereby determine an angle between the first and second portion.

Although some of the present embodiments may be described and illustrated as being implemented in certain types of devices, these are only examples of a device and not a limitation. As those skilled in the art will appreciate, the present embodiments are suitable for application in a variety of different types of devices, such as portable and mobile devices, for example, in laptop computers, tablet computers, game consoles or game controllers, various wearable devices, etc.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The embodiments illustrated and described herein as well as embodiments not specifically described herein but within the scope of aspects of the claims constitute exemplary means for pivoting and/or locking a first and second portion of an electronic device. Pivot elements, hinge regions and hinge elements 103, 403, 503 illustrate exemplary pivoting means for pivoting the first and second portions relative to each other. The first and second magnets 108, 108', 208, 308, 308', 408, 408', 508, 508' illustrate exemplary magnetic means for providing a magnetic field. The pivot axes 109, 109', 309, 309', 409, 409', 509, 509' and shafts 216 constitute exemplary pivoting means for rotating the first and second magnet with respect to the first and second portion. The magnetic shields 111, 111', 211, 311, 311', 411, 411', 511, 511' constitute exemplary magnetic shielding means for magnetically shielding the first and second magnet and thereby restricting their magnetic fields. The returning elements 215, 315, 315', 415, 415' illustrate exemplary means for returning the first and second magnet to the release position. The sensor 517 constitutes exemplary sensing means for detecting at least one of the magnetic fields of the first and second magnet and thereby determining an angle between the first and second portion.

The term "comprising" is used in this specification to mean including the feature(s) or act(s) followed thereafter, without excluding the presence of one or more additional features or acts.

The invention claimed is:

1. An electronic device or electronic device assembly, comprising:
   a first portion and a second portion;
   a first returning element disposed inside the first portion;
   a second magnetic release element disposed inside the second portion;
   a first magnet disposed inside the first portion and rotatable about a first pivot axis that is parallel to a first magnetic axis of the first magnet, the first magnet having a first end and a second end opposite the first end, the second end being coupled to the first returning element;
   a second magnet disposed inside the second portion and rotatable about a second pivot axis that is parallel to a second magnetic axis of the second magnet, the second magnet having a third end and a fourth end opposite the third end, the fourth end being coupled to the second returning element;
   wherein when the first magnet is within a threshold distance of the second magnet:
     the second end of the first magnet is released from the first magnetic release element and the fourth end of the second magnet is released from the second magnetic release element; and
     the first magnet and the second magnet rotate so that the second end of the first magnet and the fourth end of the second magnet magnetically engage each other.

2. An electronic device or electronic device assembly as defined in claim 1, wherein the first release element restricts a magnetic field of the first magnet and the second release element restricts a magnet field of the second magnet.

3. An electronic device or electronic device assembly as defined in claim 1, wherein the polarities of the first magnet and the second magnet are configured to remain unchanged when the first and second magnet are rotated.

4. An electronic device or electronic device assembly as defined in claim 1, wherein the first release element is does not rotate when the first magnet rotates and wherein the second release element does not rotate when the second magnet rotates.

5. An electronic device or electronic device assembly as defined in claim 1, wherein each of the first portion and second portion has at least two opposite main faces and a first end, and the first and second magnets are disposed near to the first ends of the first and second portion, respectively, so that the first and second magnet are configured to rotate so that they magnetically engage each other to be magnetically locked with the first ends facing each other.

6. An electronic device or electronic device assembly, comprising
   a first portion and a second portion pivotably connected to each other;
   a first magnetic release element disposed inside the first portion;
   a second magnetic release element disposed inside the second portion;
   a first magnet having a magnetic field, the first magnet being disposed inside the first portion and rotatable about a first pivot axis between a release position and a locking position, the first pivot axis being parallel to a first magnetic axis of the first magnet, the first magnet having a first end and a second end opposite the first end, the second end being coupled to the first returning element when the first magnet is in the release position;
   a second magnet having a magnetic field, the second magnet being disposed inside the second portion and rotatable about a second pivot axis between a release position and a locking position, the second pivot axis being parallel to a second magnetic axis of the second magnet, the second magnet having a third end and a fourth end opposite the third end, the fourth end coupled to a second shield that restricts a magnetic field of the second magnet, the fourth end being coupled to the second returning element when the second magnet is in the release position; and
   wherein the first magnet and second magnet are configured to rotate to the locking position when a distance between the first end of the first magnet and the fourth end of the second magnet is equal to or smaller than a threshold distance, and to the release position when the distance between the first end of the first magnet and the fourth end of the second magnet is greater than the first distance.

7. An electronic device or electronic device assembly as defined in claim 6, wherein the electronic device or electronic device assembly comprises a sensor configured to detect at least one of the magnetic field of the first magnet and the magnetic field of the second magnet and thereby determine an angle between the first and second portion.

8. An electronic device or electronic device assembly as defined in claim 6, wherein a strength of the magnetic field outside of the first and second portion is configured to be at most 100 mT with the first and second magnet being in the release position.

9. An electronic device or electronic device assembly as defined in claim 6, wherein each of the first portion and second portion has at least two opposite main faces, and the first and second magnet are symmetrically rotatable towards both of the at least two opposite main faces.

10. An electronic device or electronic device assembly as defined in claim 6, wherein the first and second magnet are rotatable between at least +80° and −80° or between at least +90° and −90°.

11. An electronic device or electronic device assembly as defined in claim 6, wherein the polarities of the first magnet and the second magnet are configured to remain unchanged when the first and second magnet are rotated.

12. An electronic device or electronic device assembly as defined in claim 6, wherein the electronic device or electronic device assembly is pivotable between a closed position and an open position, wherein in the closed position, the first and second magnet are in the locking position, thereby locking the electronic device or electronic device assembly in the closed position, and in the open position, the first and second magnet are in the release position.

13. An electronic device or electronic device assembly as defined in claim 6, wherein the electronic device or electronic device assembly is pivotable to a flat position, wherein in the flat position, the first and second magnet are in the locking position.

14. An electronic device or electronic device assembly as defined in claim 6, wherein the first magnetic release element is configured to return the first magnet to the release position and the second release element is configured to return the second magnet to the release position when the distance between the first and second magnet is greater than the first distance.

15. An electronic device or electronic device assembly as defined in claim 14, wherein at least one of the first and second release elements is an elastic element or a magnetically attractable element.

16. An electronic device or electronic device assembly, comprising
- a first portion and a second portion pivotably connected to each other;
- a first magnet disposed inside the first portion and rotatable about a first pivot axis that is parallel to a first magnetic axis of the first magnet, the first magnet having a first end and a second end opposite the first end, the second end being coupled to a first returning element when the first magnet is in the release position;
- a second magnet disposed inside the second portion and rotatable about a second pivot axis that is parallel to a second magnetic axis of the second magnet, the second magnet having a third end and a fourth end opposite the third end, the fourth end being coupled to the second returning element when the second magnet is in the release position; wherein the first portion is pivotable with respect to the second portion between an open position and a closed position with the first end of the first magnet and the fourth end of the second magnet being magnetically engaged to each other in the closed position.

17. An electronic device or electronic device assembly as defined in claim 16, wherein the electronic device or electronic device assembly is pivotable to a flat position, wherein in the flat position, the first and second magnet magnetically engage each other, thereby locking the electronic device or electronic device assembly into the flat position.

18. An electronic device or electronic device assembly as defined in claim 16, wherein the first portion and the second portion are pivotally connected via a pivot or hinge region, and the first and second magnet are disposed near to the pivot or hinge region.

19. An electronic device or electronic device assembly as defined in claim 16, wherein each of the first portion and second portion has two opposite main faces, and the first and second magnet are symmetrically rotatable towards both of the two opposite main faces.

20. An electronic device or electronic device assembly as defined in claim 16, wherein the electronic device or electronic device assembly comprises a sensor configured to detect at least one of the magnetic fields of the first and second magnet and thereby determine an angle between the first and second portion.

* * * * *